(12) United States Patent
Yin et al.

(10) Patent No.: US 10,720,358 B2
(45) Date of Patent: Jul. 21, 2020

(54) SEMICONDUCTOR DEVICE HAVING A LINER LAYER WITH A CONFIGURED PROFILE AND METHOD OF FABRICATING THEREOF

(71) Applicant: Taiwan Semiconductor Manufacturing Co., Ltd., Hsinchu (TW)

(72) Inventors: Joanna Chaw Yane Yin, Hsinchu (TW); Hua Feng Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/906,092

(22) Filed: Feb. 27, 2018

(65) Prior Publication Data

US 2019/0006235 A1  Jan. 3, 2019

Related U.S. Application Data

(60) Provisional application No. 62/527,423, filed on Jun. 30, 2017.

(51) Int. Cl.
| | |
|---|---|
| *H01L 21/768* | (2006.01) |
| *H01L 29/66* | (2006.01) |
| *H01L 23/535* | (2006.01) |
| *H01L 29/78* | (2006.01) |
| *H01L 23/532* | (2006.01) |
| *H01L 23/485* | (2006.01) |
| *H01L 21/8238* | (2006.01) |
| *H01L 27/092* | (2006.01) |
| H01L 21/285 | (2006.01) |

(52) U.S. Cl.
CPC .. *H01L 21/76865* (2013.01); *H01L 21/76805* (2013.01); *H01L 21/76843* (2013.01); *H01L 21/76846* (2013.01); *H01L 21/76889* (2013.01); *H01L 21/76895* (2013.01); *H01L 21/823821* (2013.01); *H01L 23/485* (2013.01); *H01L 23/535* (2013.01); *H01L 23/53266* (2013.01); *H01L 27/0924* (2013.01); *H01L 29/66795* (2013.01); *H01L 29/785* (2013.01); *H01L 29/7851* (2013.01); *H01L 21/28518* (2013.01); *H01L 21/76855* (2013.01)

(58) Field of Classification Search
None
See application file for complete search history.

(56) References Cited

U.S. PATENT DOCUMENTS

| 8,772,109 B2 | 7/2014 | Colinge |
|---|---|---|
| 8,785,285 B2 | 7/2014 | Tsai et al. |
| (Continued) | | |

FOREIGN PATENT DOCUMENTS

| JP | 2010503224 | 1/2010 |
|---|---|---|
| KR | 20030058230 | 7/2003 |
| KR | 20040053318 | 6/2004 |

*Primary Examiner* — Long Pham
(74) *Attorney, Agent, or Firm* — Haynes and Boone, LLP (57) ABSTRACT

Devices and methods that include for configuring a profile of a liner layer before filling an opening disposed over a semiconductor substrate. The liner layer has a first thickness at the bottom of the opening and a second thickness a top of the opening, the second thickness being smaller that the first thickness. In an embodiment, the filled opening provides a contact structure.

20 Claims, 10 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,570,574 B1 | 2/2017 | Adusumilli et al. |
| 9,576,814 B2 | 2/2017 | Wu et al. |
| 2003/0089946 A1 | 5/2003 | Hshieh et al. |
| 2006/0246726 A1* | 11/2006 | Goller ............... H01L 21/76838 438/692 |
| 2008/0054326 A1 | 3/2008 | Wong et al. |
| 2014/0327089 A1* | 11/2014 | Cai ....................... H01L 29/785 257/401 |
| 2016/0322304 A1 | 11/2016 | Kim et al. |

* cited by examiner

SEMICONDUCTOR DEVICE HAVING A LINER LAYER WITH A CONFIGURED PROFILE AND METHOD OF FABRICATING THEREOF

CROSS-REFERENCE TO RELATED APPLICATION

This application claims the benefit of U.S. Provisional Application No. 62/527,423, filed Jun. 30, 2017.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as semiconductor device features become closer in proximity to one another, so do the respective contact elements providing a connection to the device features. Forming these tightly constrained and often of significant height features can raise processing challenges. These process margins can be further tightened during FinFET fabrication processes. In particular, decreasing fin pitches and increasing fin heights are significantly constraining abilities of existing processes for forming contact features to source and drain or gate features of the FinFET device. Accordingly, although techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

It is also noted that the present disclosure presents certain exemplary embodiments in the form of multi-gate transistors or fin-type multi-gate transistors referred to herein as Fin-FET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. The present disclosure also applies equally to planar devices such as planar FETs.

As discussed above, as technology nodes shrink, it becomes more challenging to fabricate certain aspects of semiconductor devices, including, for example, as widths (e.g., diameters) of openings shrink it can become more challenging to subsequently fill said opening with material. Typical filling methods can cause quality and/or reliability issues such as the formation of seams or voids in the fill material of the opening. As but one example, filling the opening formed for contact structures can cause device performance issues such as higher resistance of the contact structure due to these seams or voids. Another aspect worth consideration is that it may be desired to fill openings with multi-layers of materials. For example, liner layers that act as barrier layers or glue layers can be deposited in the opening to prevent diffusion from the subsequently deposited fill material in the opening to the material surrounding the opening. For example, barrier/glue layers may be used in contact openings to prevent metal fill from diffuses into adjacent dielectric material in the gate structure or interlayer dielectric (ILD). However, as the width of the opening decreases with shrinking technology nodes, the required thickness of the liner layer can take up a greater and greater percentage of the opening. In some cases, the liner layer (e.g., barrier/glue layer) can take up ⅓ to ¼ of the width of the opening leaving the remaining portion of the opening having a reduced width that is difficult to fill with the low-resistance contact metal. Challenges in filling the opening can also be recognized in deposition methods that cause agglomeration of material at a top of the opening referred to as "overhang" (e.g., physical vapor deposition).

Certain structures and methods described herein can allow for filling of an opening formed in semiconductor device fabrication that reduces or even eliminates the seam and/or void formation and/or reduces other challenges discussed above. As discussed in detail below, the methods and structures in some embodiments provide for a modified profile of liner layer (e.g., barrier and/or glue layer). The modified profile liner layer exhibits a difference in thickness between various regions of the layer. The modified profile in some embodiments allows for the liner to function as an appropriate adhesion promoter and/or diffusion prevention layer, while also provided adequate spacing for additional layers, such as additional metal layers, to be subsequently formed within the opening.

Figure 1:
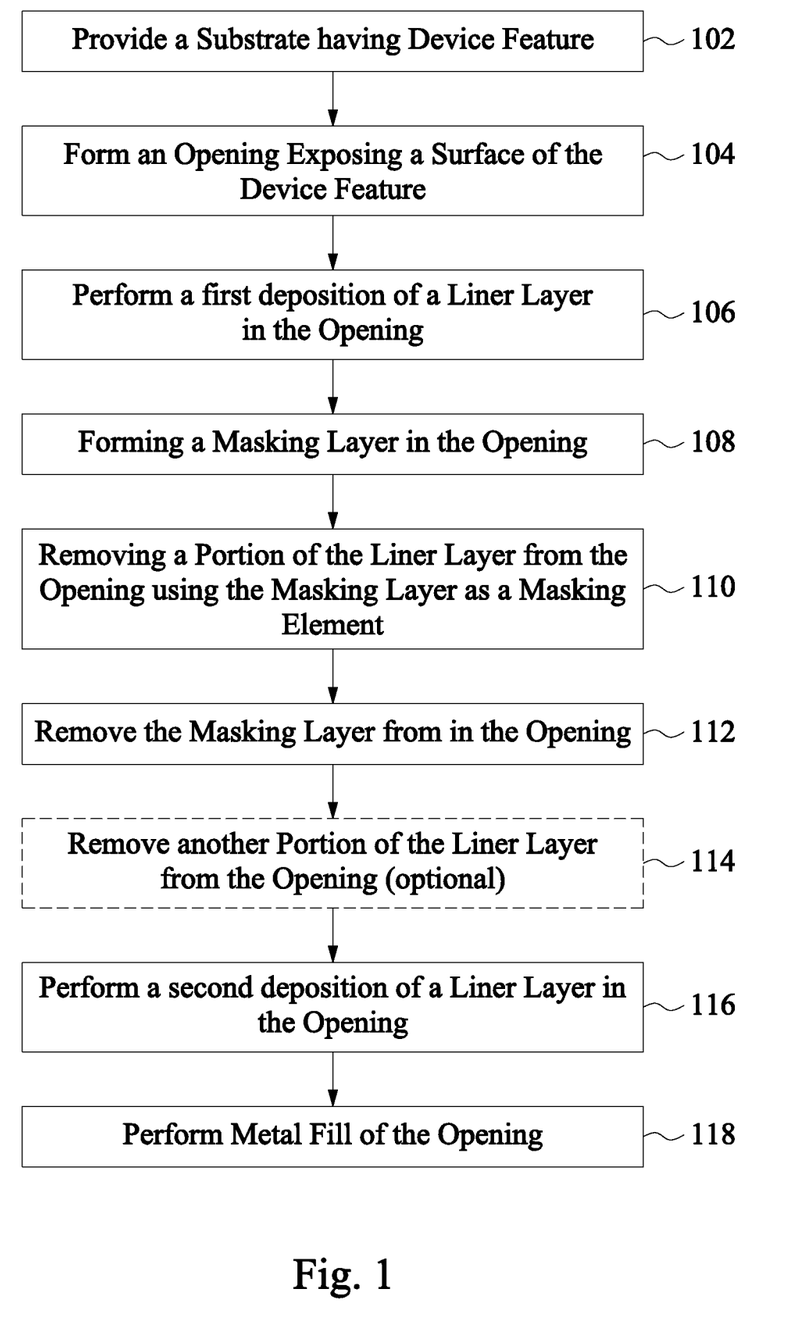
FIG. 1 is a flow chart of a method for fabricating a semiconductor device according to various aspects of the present disclosure.

FIG. 1 is a flow chart of a method 100 for fabricating an integrated circuit device according to various aspects of the present disclosure. In the present embodiment, method 100 fabricates an integrated circuit device that includes a transistor device such as a FinFET device or planar FET device having a gate and associated source/drain. FIGS. 2-9 are exemplary cross-sections of a device 200 fabricated according to steps of the method 100. FIGS. 2-9 have been simplified for the sake of clarity to better understand the inventive concepts of the present disclosure. Additional features can be added in the device 200, and some of the features described below can be replaced, modified, or eliminated in other embodiments of the device 200. It is also recognized that the device 200 implies a coplanarity to the contact structures, which is provided for ease of illustration and not intended to be limiting to this configuration.

The device 200 includes a semiconductor device of a transistor, which can be included in a microprocessor, memory cell, and/or other integrated circuit device. Furthermore, the device 200 may be an intermediate device fabricated during processing of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOSs) transistors, bipolar transistors, high voltage transistors, high frequency transistors, other suitable components, or combinations thereof.

The method 100 begins at block 102 where a substrate is provided. Using the example of FIG. 2, the substrate 202 is a substrate of the exemplary device 200. In an embodiment, the substrate 202 is a silicon substrate (e.g., wafer). Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor-on-insulator (SOI) such as having a buried dielectric layer. In embodiments, the substrate 202 includes active regions such as p-wells and n-wells for forming active devices and may include interposing isolation regions (e.g., shallow trench isolation (STI) features).

The substrate provided in block 102 has a contact region where a conductive contact structure is to be formed. The contact structures, as discussed below, are formed by creating contact holes in an insulating layer to formed electrical connection to the contact areas in the semiconductor substrate. These contact holes or openings can be subsequently filled with conductive material (e.g., metal) step coverage to insure reliable electrical contact with low contact resistance provided there is sufficient step coverage. The contact structure may be between a gate structure and an overlying interconnect layer, a source/drain feature, and/or connection between other semiconductor device components, active or passive and an overlying conductive layer. While a contact structure is formed in the present example, it is noted that other embodiments that may implement portions of the disclosure may also be possible including for example, using the method 100 to provide a conductive structure to connect interconnect layers (e.g., also referred to as a via), portions of post-passivation interconnect structures (PPI), through substrate vias, a replacement gate method where a trench is filled with a metal gate, and/or other features formed on a substrate where a hole or trench is desired to be filled.

In an embodiment, at block 102 a substrate suitable to fabricate a planar field effect transistor is provided where the substrate includes a channel region under a gate and between a source and drain region. The contact structure is desired to be connected to one or more features of the planar FET (e.g., gate, source/drain). In an embodiment, at block 102 a substrate having a fin structure is provided, where the fin structure includes a channel region under a gate and between a source region and a drain region. The contact structure is desired to be connected to one or more features of the FINFET (e.g., gate, source/drain). It is noted that the illustrations of the figures of the present application apply to each of a planar or a FINFET device (e.g., the cross-sectional cut being a long a fin represented by 202). Referring again to the example of FIG. 2, the device 200 includes a plurality of gate structures 204 and a plurality of associated source/drain regions 206.

Figure 2:
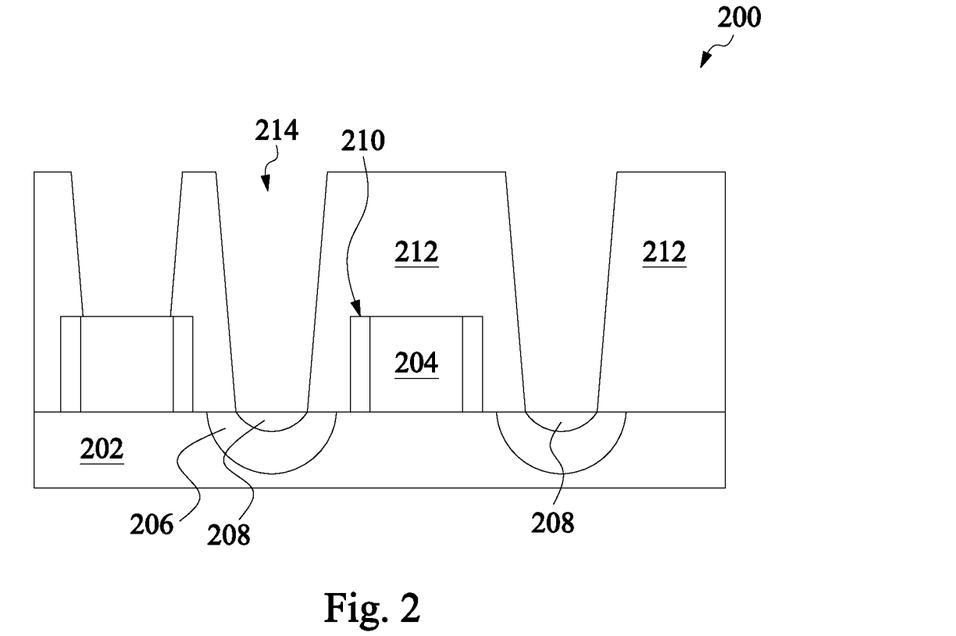
FIGS. 2-9 are cross-sectional views of a semiconductor device fabricating according to steps of an exemplary embodiment of the method of FIG. 1 according to various aspects of the present disclosure.

The gate structure or gate stack 204 includes a gate dielectric layer and a gate electrode layer. The gate dielectric layer may include silicon oxide or a high-k dielectric material such as hafnium oxide, zirconium oxide, lanthanum oxide, titanium oxide, yttrium oxide, strontium titanate, and/or other suitable material. The gate dielectric layer may be formed by chemical oxidation, thermal oxidation, atomic layer deposition (ALD), chemical vapor deposition (CVD), and/or other suitable methods. In an embodiment, the gate electrode layer includes polysilicon, and may be formed by suitable deposition processes such as low-pressure chemical vapor deposition (LPCVD) and plasma-enhanced CVD (PECVD). In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes.

In FIG. 2, in some embodiments, the gate structure 204 is a polysilicon gate. In some embodiments, the gate stack 204 is formed by a replacement gate process such as that including forming a sacrificial gate structure, i.e., a placeholder for a final gate stack. In some embodiments, the gate structure 204 includes an interfacial layer between its gate dielectric layer and a channel region of the substrate 202. The interfacial layer may include a dielectric material such as silicon oxide or silicon oxynitride, and may be formed by chemical oxidation, thermal oxidation, ALD, CVD, and/or other suitable dielectric. The gate structure 204 may include other layers such as hard mask layer(s) (see hard mask layer 204A below).

Spacer elements 210 abut the sidewalls of the gate structure 204. The spacer elements 210 may include one or more layers of dielectric material providing for example, seal spacers and/or offset spacers. Exemplary dielectric compositions for the spacer elements 210 include silicon oxide, silicon nitride, silicon oxynitride, silicon carbide, other suitable material, or combinations thereof. In some embodiments, the spacer elements 210 are formed by depositing dielectric material over the substrate 202 and the gate structure 204 and subsequently anisotropically etching the material to form the spacer elements 210. During the etching processes, dielectric material of the spacers is removed from a portion of substrate 202, more particularly, over the source/drain regions 206. Implantation, diffusion, and/or annealing processes may be performed to form lightly doped source and drain (LDD) features in source/drain regions 206 before and/or after forming spacer elements 210.

The source/drain regions 206 are disposed adjacent the gate structures 204. In some embodiments, the source/drain regions 206 are suitably doped regions of the substrate 202. In some embodiments, the source/drain regions 206 are epitaxially grown material (e.g., that may be the same or different in semiconductor composition than the substrate 202). The source/drain features 206 are doped with n-type dopants and/or p-type dopants to provide suitable conductivity to form the device 200. The dopants may be introduced by ion implantation, diffusion, during the epitaxial growth process, and/or other suitable processes. In some embodiments, the introduction of the dopants is followed by an anneal process.

For example, in some implementations, where the device 200 is configured as an n-type device (for example, having an n-channel), source/drain features 206 include silicon or silicon carbon that is doped with phosphorous, arsenic, other n-type dopant, or combinations thereof (for example, forming Si:P epitaxial layers or Si:C:P epitaxial layers). In some implementations, where the device 200 is configured as a p-type device (for example, having a p-channel), the source/drain features 206 include silicon germanium (SiGe) doped with boron, other p-type dopant, or combinations thereof (for example, forming a Si:Ge:B epitaxial layer).

A silicide region 208 is disposed on a top region of the source/drain regions 206. The silicide region 208 includes a metal silicide composition. The metal silicide may include nickel silicide, cobalt silicide, tungsten silicide, tantalum silicide, titanium silicide, platinum silicide, erbium silicide, palladium silicide, or combinations thereof. The silicide region 208 may be a portion of the source/drain features 206 (e.g., lie below a plane coplanar with a top surface of the substrate 202). The silicide region 208 may be formed by depositing a metal composition over the source/drain features 206 and performing an anneal to form the silicidation of a top portion of the source/drain features.

A dielectric layer 212 is disposed over the substrate 202; the dielectric layer 212 is also referred to as an interlayer dielectric (ILD) layer. The dielectric layer 212 may be formed by a deposition process (such as chemical vapor deposition (CVD), physical vapor deposition (PVD) or other suitable methods). Dielectric layer 212 includes a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In some embodiments, dielectric layer 212 is a low-k dielectric layer. In some implementations, dielectric layer 212 can include a multilayer structure having multiple dielectric materials.

It is noted that a contact etch stop layer (not specifically enumerated) may be disposed between the gate structure 204 (spacer elements 210) and the interlayer dielectric (ILD) 212.

Having provided a substrate having a plurality of features and/or layers disposed thereon with a contact region defined, the method 100 then proceeds to block 104 where openings (also referred to as holes or trenches) are formed in a layer(s) in the contact region in order to expose a top surface of an underlying feature. In an embodiment, one or more openings expose a surface of the source/drain region 206 (specifically the silicide 208 of the source/drain region 206). In an embodiment, one or more of the openings expose a top surface of the gate structure 204. The top surface of the gate structure may be conductive such as, silicide or the conductive fill metal of a metal gate structure such as tungsten. The openings may be formed by a suitable lithography patterning followed by etching processes such as a dry or plasma etching process. The openings for different feature types (e.g., gate and source/drain) may be formed simultaneously or in different steps. In some embodiments, the openings may have a width of between approximately 15 nanometers (nm) and 50 nm. It is noted that the cross-sectional view of FIG. 2 illustrates contact holes for both the source/drain features 206 and the gate structure 204. This is for ease of illustration and does not imply that a contact structure to a gate is coplanar with that of the source/drain feature. In other embodiments, at a region coplanar (e.g., perpendicular plane to a top surface of the substrate 202) with the source/drain contact opening 214, the gate structure 204 may have dielectric disposed there over (e.g., a hard mask layer and then the dielectric layer 212). In an embodiment, the contact opening 214 has an aspect ratio (who) of at least 1:5.

Referring to the example of FIG. 2, contact holes 214 are formed in the dielectric layer 212. The contact holes 214 as illustrated expose a top surface of the gate structure 204 and a top surface of the source/drain feature 206 (e.g., silicide 208). It is noted that in at least some embodiments, the silicide feature 208 is formed after etching the contact holes 214. For example, the openings 214 expose the source/drain features 206 and a silicidation (which may include a germano-silicidation) forms the silicide 208. For example, silicidation may be formed by depositing a metal layer (e.g., a portion of the liner layer discussed below or a separate layer) over the exposed portion of the source/drain feature 206 (e.g., epitaxial layer), annealing the metal layer such that the metal layer reacts with silicon in the source/drain features 206 to form the metal silicidation, and thereafter removing the non-reacted metal layer (if any). In other embodiments, as discussed below, the deposition of the liner layer in block 106 provides the metal composition to form the silicide feature 208. After forming the contact openings 214, a cleaning process may be performed (e.g., sputtering of inert gas). The cleaning process may remove undesired native oxide at the bottom of the opening.

The method 100 then proceeds to block 106 where a deposition of a liner layer is formed in the contact holes. The liner layer may also be referred to as a glue (or adhesion) layer (e.g., to improve adhesion between an overlying layer and the sidewall of the opening) and/or barrier layer (e.g., to prevent diffusion). In an embodiment, the liner layer is configured (e.g., thickness and composition) to prevent metal diffusion into adjacent features (e.g., gate structure 204 and/or dielectric layer 212). In an embodiment, the liner layer is configured (e.g., thickness and composition) to improve adhesion between a subsequently deposited conductive fill of the opening with dielectric sidewall materials (e.g., dielectric layer 212 such as $SiN/SiO_2$).

In an embodiment, block 106 deposits a liner layer of a metal such as titanium (Ti). In some embodiments, the metal (e.g., titanium) is deposited by physical vapor deposition (PVD) or other suitable deposition methods. The liner layer of metal may be deposed on the sidewalls and bottom of the openings 214. The Ti may interface the source/drain feature 206. A silicidation (which may include a germano-silicidation) is then performed to form the silicide 208 using the titanium and annealing the substrate such that the metal (e.g., Ti) liner layer reacts with the semiconductor (e.g., silicon) in the source/drain features 206 to form the metal silicidation.

In an embodiment, the liner layer includes in lieu of the metal layer or in addition to the metal layer (e.g., Ti), a metal nitride composition such as TaN, TiN, TiSiN, TaSiN, may be used. In an embodiment, the metal nitride composition is disposed directly on and over the first metal of the liner layer. In some embodiments, the metal of the liner layer is omitted and the metal nitride layer is disposed in the opening on the sidewalls and/or bottom of the openings. Thus, in some embodiments, where the liner layer includes a dielectric material interfacing the sidewalls of the opening, the silicide feature 208 may be formed prior to the deposition of the dielectric barrier layer. The metal nitride material such as TaN or TiN may be formed by chemical vapor deposition (CVD) and/or other suitable deposition methods.

Figure 3:
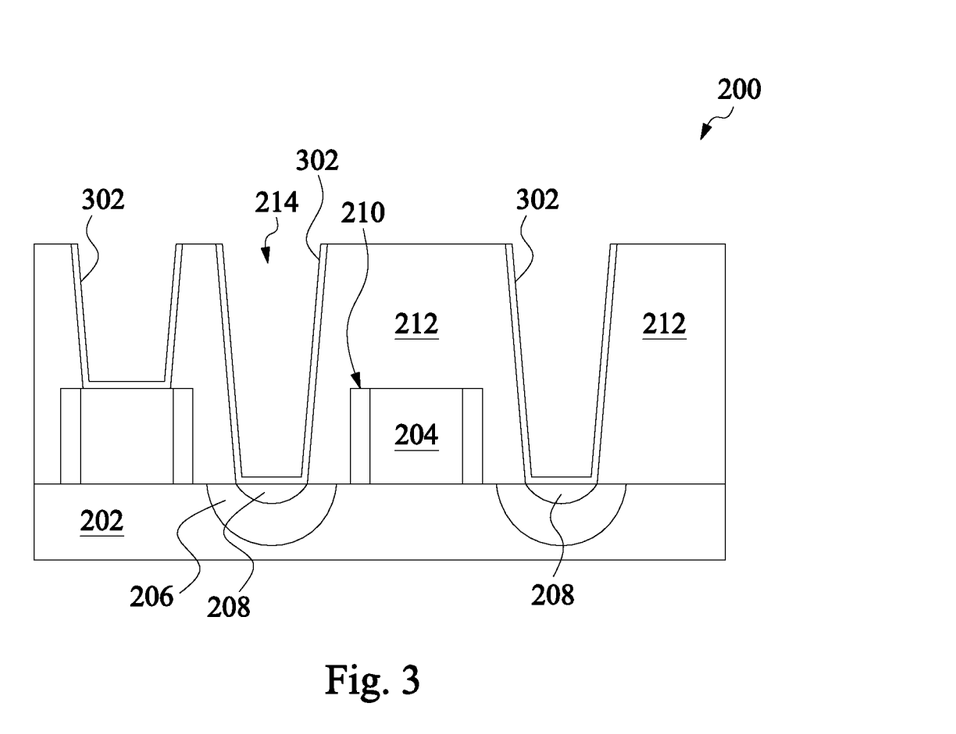

Referring to the example of FIG. 3, illustrated is a liner layer 302. As discussed above, in an embodiment, the liner layer 302 includes a metal such as titanium. In an embodiment, the liner layer 302 of titanium is deposited and then annealed to form the silicide region 208. In another or further embodiment, the liner layer 302 includes TiN. For example, TiN may be formed on a metal layer such as Ti. Other examples of the liner layer 302 include TaN. In some embodiments, the liner layer 302 is a combination of layers discussed above including for example a layer having a stack of Ti/TiN.

In an embodiment, the liner layer 302 has a thickness of t1, t2 and t3 as deposited. In an embodiment, t1, t2 and t3 are substantially equal in thickness (where substantially includes thickness variations typical with a process such as, 10% or less). In an embodiment, t1, t2, and/or t3 may be between approximately of approximately 10 and 30 Angstroms. In some embodiments, the thicknesses t1, t2, t3 are provided for a composition of materials or layers (e.g., Ti and TiN) forming the liner layer. In other embodiments, the thicknesses t1, t2, and t3 are a single composition.

In some embodiments, the liner layer 302 is a metal that is used to form the silicide 208. Thus, after deposition of the liner layer 302 at thickness t1 at the bottom of the opening 214, the metal portion (e.g., Ti) of the liner layer 302 may be consumed in whole or in part at the bottom of the opening 214 during the silicidation of the source/drain 206. While not specifically illustrated, in some embodiments, the liner layer 302 is also disposed on a top surface of the dielectric layer 212. The liner layer 302 on the dielectric layer 212 may be subsequently removed by a planarization process.

The method 100 of FIG. 1 then proceeds to block 108 where a masking layer is formed in the opening of the contact. The masking layer may be formed over a portion of the liner layer deposited in block 106. The masking layer may include a bottom antireflective coating (BARC) material. "BARC" materials can refer to organic and inorganic BARC materials. Organic BARCs include, but are not limited to, polysulfones, polyureas, polyurea sulfones, polyacrylates and poly(vinyl pyridine). Inorganic BARCs include, but are not limited to, silicon oxynitrides (SiOxNy). Other examples of the masking material include photoresist, polymers, and/or other suitable material.

In some embodiments, the masking material is deposited by a suitable deposition process such as, spin on coating, CVD, or other suitable deposition process and subsequently the material is etched back to a desired height. The etchback may maintain the masking material in the contact opening at a height that is a greater distance from a top surface of the substrate than a top surface of a gate structure.

Figures 4, 5:
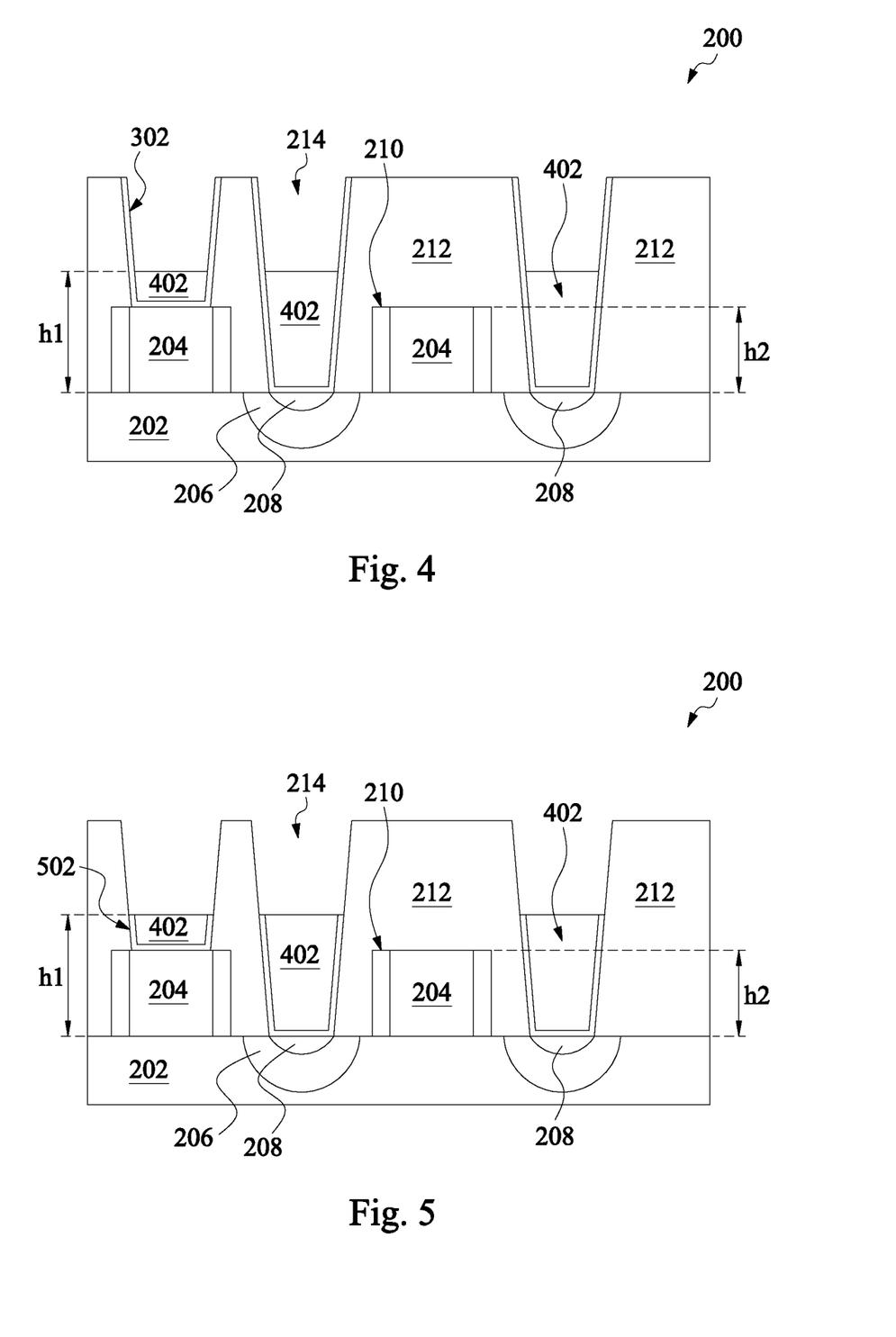

Referring to the example of FIG. 4, a masking material 402 is formed in the contact opening 214 over the liner layer 302. The masking material 402 has a height h1 from a top surface of the semiconductor substrate 202. The gate structure 204 has a height h2 from a top surface of the semiconductor substrate 202. h1 is greater than h2. In an embodiment, h1 is between approximately 20% and 50% greater than h2. Having h1 greater than h2 can mitigate or prevent damage to gate materials (e.g., work function metals) of the gate structure 204 below the contact opening 214.

The method 100 then proceeds to block 110 where a portion of the liner layer is removed from the opening while using the masking layer as a masking element. Thus, the etching process of block 110 may be selective to the liner layer material. In an embodiment, the removal of the portion of the liner layer is performed by a wet etching process. In an embodiment, the etching process is acid-based. In some embodiments, the etching includes Hcl:H2O2:H2O ("standard clean 2" or SC2). In other embodiments, other etchants are used that maintain a selectivity to the liner layer, while reducing or eliminating the etching of the masking layer.

Referring to the example of FIG. 5, while the masking layer 402 is disposed in the opening 214, the exposed liner layer 302 is removed from a top portion of the sidewalls of the opening 214. The liner layer at portions under the masking element 402 is maintained, denoted now as remaining or etched liner layer 502. In an embodiment, the etching continues to substantially or wholly remove the liner layer 302 from the upper portions of the sidewalls exposing the dielectric 212 as illustrated. In other embodiments, a thin film of the remaining liner layer 502 (e.g., residual) may be maintained on the upper sidewalls of the opening 214.

The method 100 then proceeds to block 112 where the masking layer is removed from the opening. The masking layer may be stripped from the substrate. In an embodiment, the masking layer is removed by an ashing process. Referring to the example of FIG. 6, the masking layer 402 has been removed from the openings 214.

In an embodiment of the method 100 of FIG. 1, the method 100 after block 112 proceeds to block 116 where another (e.g., second) deposition of one or more of the materials of the liner layer is performed. The liner layer deposited in block 116 may be the same composition as that deposited in block 106, described above. In an embodiment, the liner layer deposited in block 116 is TiN or TaN. In an embodiment, the liner layer deposited in block 106 includes Ti followed by TiN and the liner layer in block 116 includes only TiN.

The second deposition of material of the liner layer in block 116 may include depositing material on the upper sidewalls of the contact opening (e.g., where the liner layer has been previously removed), the lower sidewalls of the contact opening (e.g., where the previously deposited liner layer may remain), and the bottom of the opening (e.g., where the previously deposited liner layer may remain). The deposition of block 116 may be performed by CVD or other suitable deposition methods.

Thus, the resultant liner layer provided by the embodiment of the method 100 has a different thickness at the bottom of the opening and the lower sidewalls of the opening than the upper sidewalls. This is because the portions of the liner layer at the lower sidewalls and bottom include material from the first deposition (block 106) as well as the second deposition (block 116), while the upper portion of the liner layer adjacent the upper sidewalls of the opening is thinner as it includes material only from the second deposition (block 116) or a thinner residual material from the first deposition (block 106) and material from the second deposition (block 116). Following the composition of the upper portion may be dictated by the deposition of the block 116, while the composition of the portion of the liner layer at the lower sidewalls includes that of both deposition steps.

Figure 6:
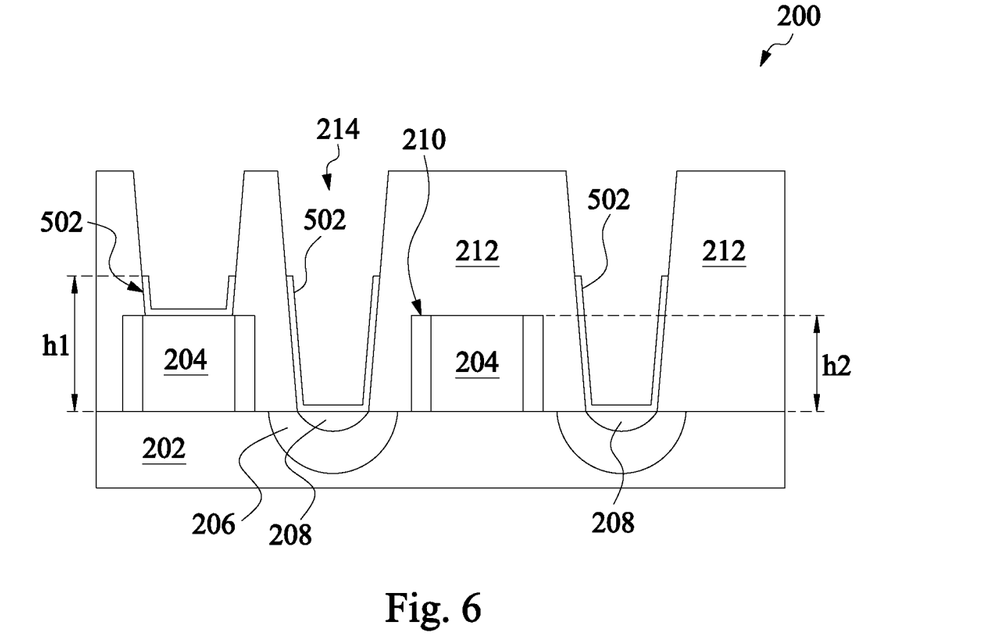
Figure 7:
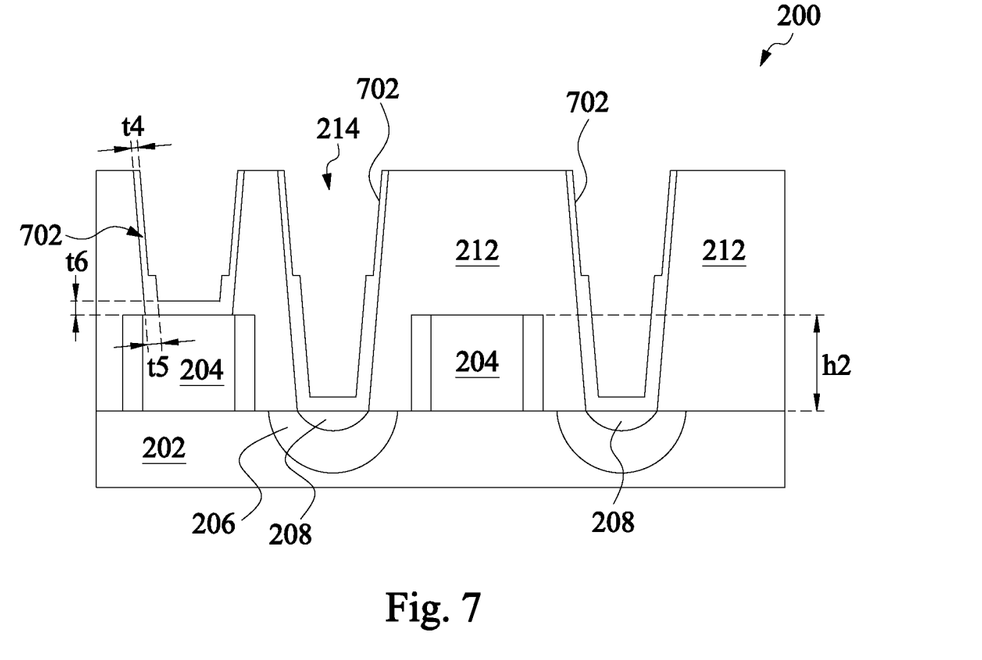
Figure 8:
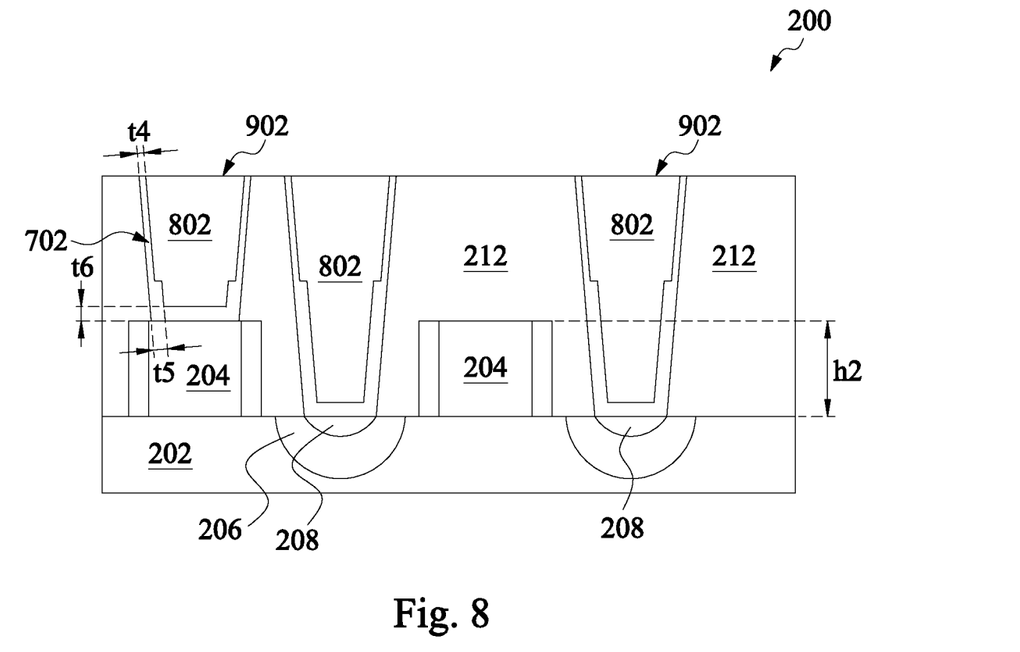
Figure 9:
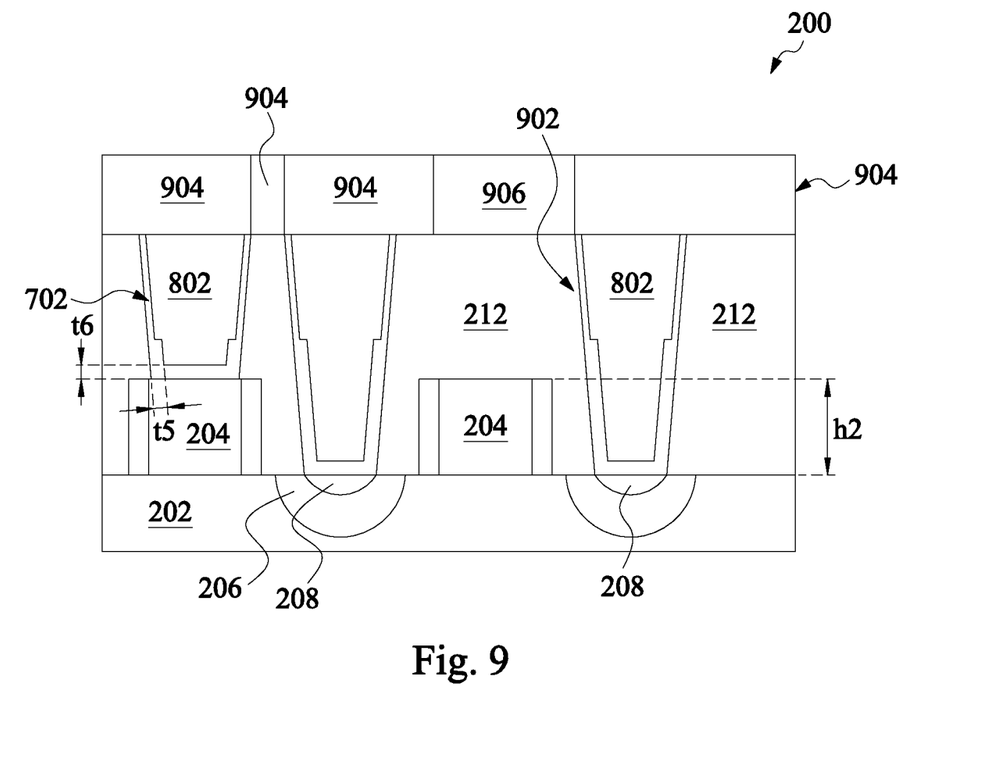

Referring to the example of FIG. 7, the liner layer 702 has been formed by performing a second deposition of liner layer material on the remaining liner layer 502 of FIG. 6. The liner layer 702 has a thickness t4 at the upper sidewalls of the opening 214 (e.g., sidewalls greater than height h1). The liner layer 702 has a thickness t5 at the lower sidewalls of the opening 214 (e.g., less than height h1). The liner layer 702 has a thickness t6 at the bottom of the opening 214. t5 and t6 may be substantially equal. t5 and t6 may each be greater than t4. In an embodiment, a ratio of t5 (or t6) to t4 is approximately 2:1. In an embodiment, a ratio of t3:t4 may be approximately 1:2. It is reiterated that t5 and t6 result from the liner layer deposited in block 106 and block 116.

It is noted that because the liner layer is thinner at a top portion of the opening (e.g., t4), depositing additional layers over the liner layer can be performed in some embodiments such that there is a mitigation or prevention of formation of metal seam/void defects in the contact structure. This is because the available width of the remaining opening is greater. It is also noted that the thickness t6 should be controlled to account for the trade-off between barrier integrity with contact resistance, e.g., the thicker t6 the greater the barrier integrity at the expense of increasing contact resistance. It is recognized however in some embodiments that t4 must be maintained such that it is sufficient to continue to prevent diffusion (e.g., between 802 and 212).

The method 100 continues to perform a metal fill of the opening having the liner layer to form the contact structure. In an embodiment, a metal-containing fill layer of conductive material or materials is deposited into the contact hole. For example, an aluminum-containing metal fill layer may be deposited. Other exemplary materials include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some embodiments, the metal fill layer 802 includes a plurality of layers. Referring to the example of FIG. 8, a contact fill metal 802 is provided filling the contact opening 212. The deposited fill metal may be planarized to form the contact structure 902 including the fill metal 802 and liner layer 702.

In some implementations of the method 100, additional layers of a multilayer interconnect (MLI) feature are formed on the substrate. The MLI feature electrically couples various components of the device 200, such that the various components are operable to function as specified by design requirements of the device 200. The MLI feature can include a combination of metal layers and ILD layers configured to form vertical interconnect features, such as contact structure and/or vias, and/or horizontal interconnect features, such as lines. The various conductive features include materials similar to the contact structures. In some implementations, a damascene process and/or dual damascene process is used to form a copper-based multilayer interconnection structure. By way of example in FIG. 9, a first metal line 904 (e.g., copper interconnect of an MLI) is formed over the contact structure 902. Interconnect line 904 may be electrically coupled to the contact structure 902. Another ILD layer 906 may be disposed over the dielectric layer 212.

Thus, an embodiment of the method 100 provides for configuring a liner layer profile such that it may be in some embodiments suitable for adhesion and/or diffusion barrier, but reduced in thickness at an upper portion of the opening.

In another embodiment of the method 100, the method 100 progresses similarly to as discussed above except that an additional selective etch step is performed after the masking layer is removed in block 112 of the method 100. That is, the method 100, in some embodiments, proceeds to block 114 of FIG. 1 after the masking layer is removed in block 112 (and prior to the deposition of material the liner layer in block 116 discussed above). Block 114 includes removing additional portions of material of the liner layer from the sidewalls of the opening. In an embodiment, the liner layer is completely removed from the sidewalls of the opening above a thickness of the liner layer disposed at the bottom of the opening. The portion of the liner layer remains at the bottom of the opening in order to protect underlying source/drain features (e.g., silicide/epitaxial layers of the source/drain) and/or gate layers such as metal layers (e.g., work function) of the gate structure. Thus, in an embodiment of the method 100, there is a two-step etch back process of the liner layer (e.g., block 110 and block 114).

At block 114, the removal of the additional portions of the liner layer is performed by an etching process. The etching process may use a different chemical than that of block 110. In an embodiment, the etching rate of the etching process of block 114 is slower than the block 110 with respect to the material of the liner layer. In an embodiment, the etching process of block 114 is wet etch for example, applying peroxide to the substrate.

Figure 10:
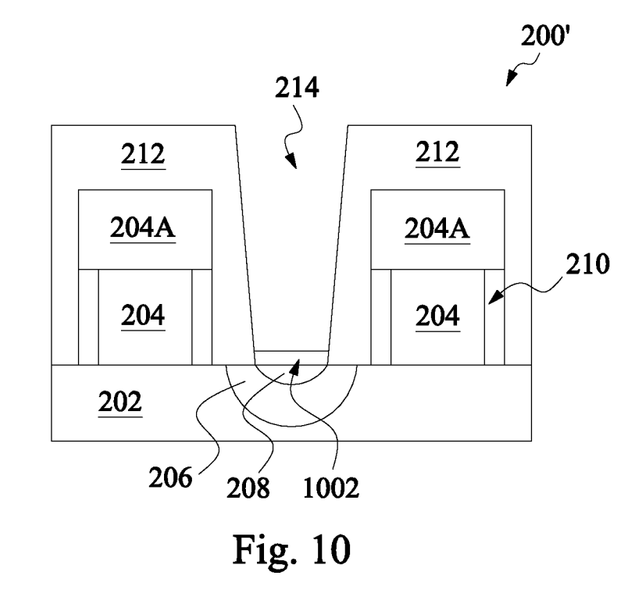
FIGS. 10-12 are cross-sectional views of a semiconductor device fabricating according to steps of another exemplary embodiment of the method of FIG. 1 according to various aspects of the present disclosure.

Referring to the example of FIG. 10, a device 200' is provided that is substantially similar to the device 200 discussed above. In fact, in some embodiments, the device 200' is fabricated from the device 200 of FIG. 6 discussed above. More specifically, providing the device 200 of FIG. 6 to block 114 allows for an additional etch of the remaining liner layer 502. FIG. 10 of the device 200' illustrates the etched liner layer 502, which as illustrated in FIG. 6, is removed from on a bottom portion of the sidewalls of the opening 214. The liner layer, denoted 1002 in FIG. 10, remains at a bottom (e.g., bottom surface) of the opening 214.

In some embodiments, with the deposition of the first liner layer (block 106), a directional plasma treatment may be performed to alter the etch selectivity of portions of the first liner layer. In an embodiment, the directional plasma treatment enhances the etch selectivity between the liner layer formed on the sidewalls of the opening and the liner layer formed on the bottom of the opening. In some embodiments, the liner layer on the sidewalls composition is modified such that it may be more easily etched. This can be beneficial in removing the portion of the liner layer abutting the bottom portion of the opening sidewalls while maintaining a portion of the liner layer at the bottom of the opening, as illustrated above.

Figure 11:
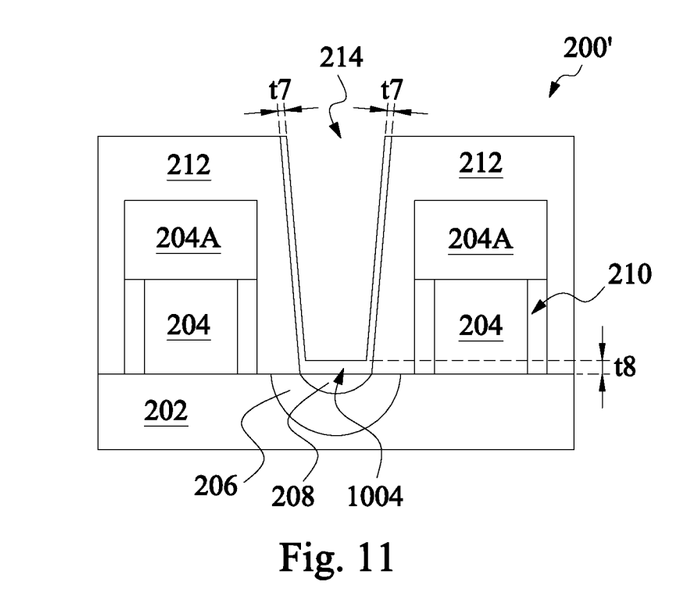

After the removal process of block 114, the embodiment of the method 100 proceeds to block 116 where material of the liner layer is deposited again. Block 116 may be substantially similar to as discussed above. Using the example of FIG. 11, a liner layer 1100 is formed by depositing liner layer material in the opening 214 including on the sidewalls and the bottom of the opening and over the liner layer 1002 (FIG. 10) remaining at the bottom of the opening. In an embodiment, a thickness of approximately t7 of liner material is deposited. Thus, provided is a liner layer 1100 having a thickness t7 on the sidewalls of the opening 214 and a thickness t8 at the bottom of the opening. t8 is greater than t7. In an embodiment, the ratio of t7 to t8 is 1 to 2.

Figure 12:
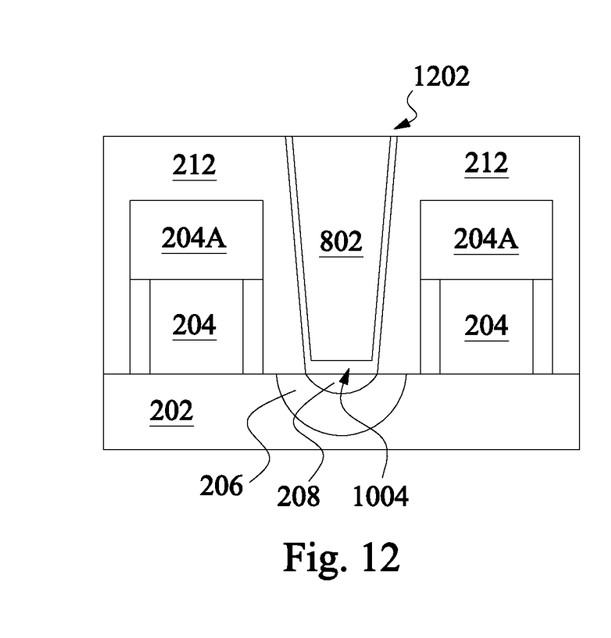

The embodiment of method 100 then proceeds to block 118 where a metal fill process is performed. Block 118 may be substantially similar to as discussed above. FIG. 12 is illustrative of the device 200' after filling the opening 214 with fill metal 802, discussed above. The contact structure 1202 includes the fill metal 802 and the configured liner layer 1100.

Thus, another embodiment of the method 100 also provides for configuring a liner layer profile such that it may be in some embodiments suitable for adhesion and/or diffusion barrier, but reduced in thickness at an upper portion of the opening as well as a lower sidewall portion of the opening.

Figure 13:
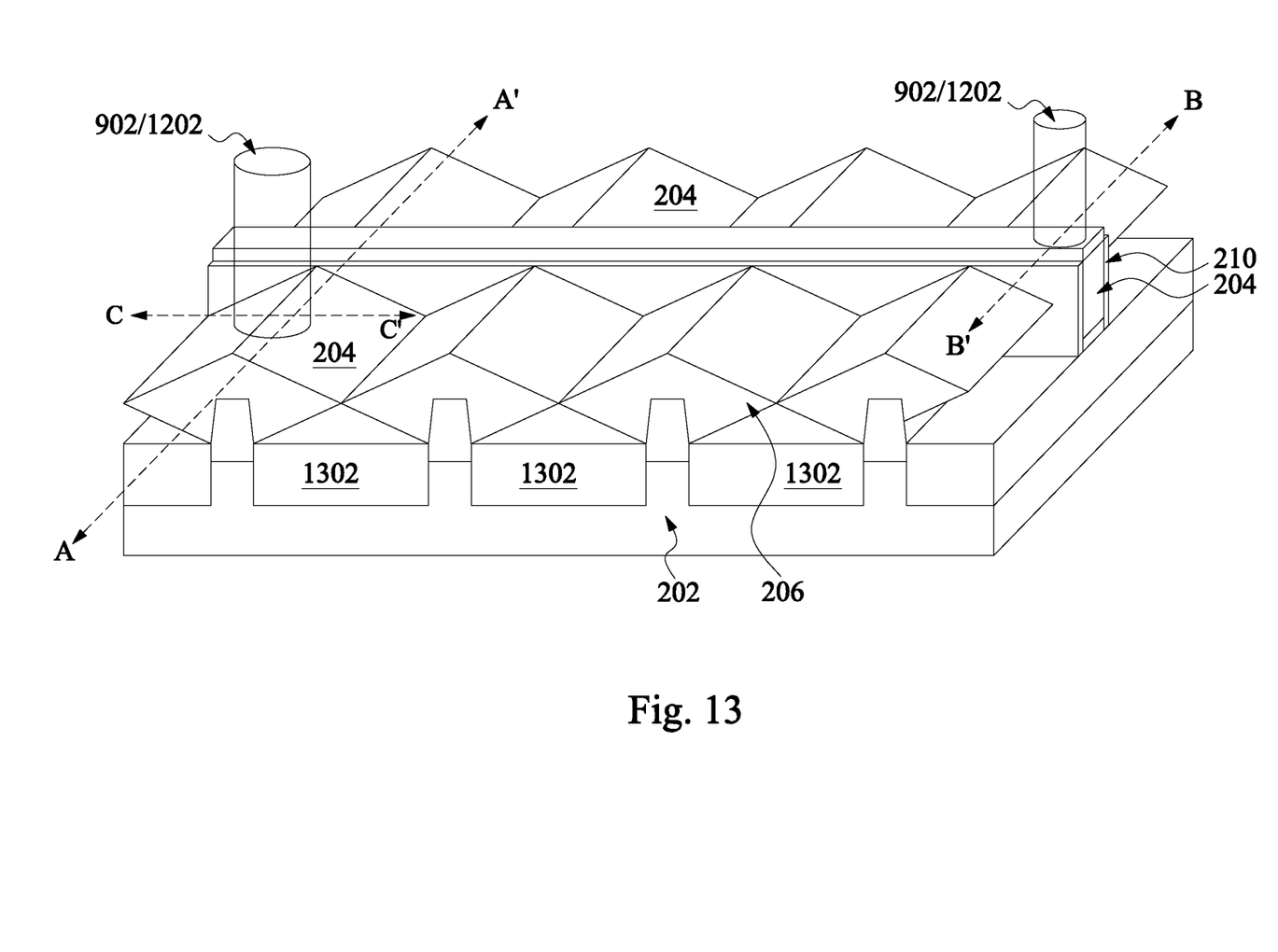
FIG. 13 is a perspective view of an embodiment of a semiconductor device according to aspects of the present disclosure.
Figure 14A:
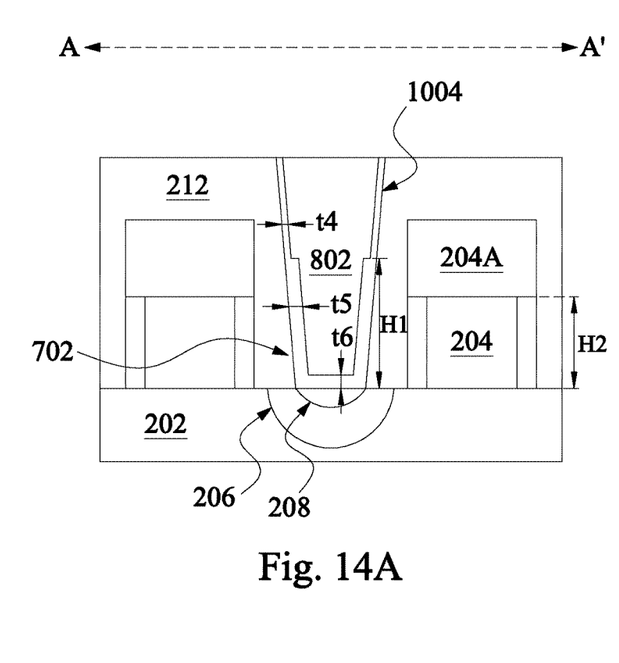
FIGS. 14A, 14B, and 14C are portions various cross-sectional views of an example embodiment of the device of FIG. 13, according to some aspects of the present disclosure.
Figure 14B:
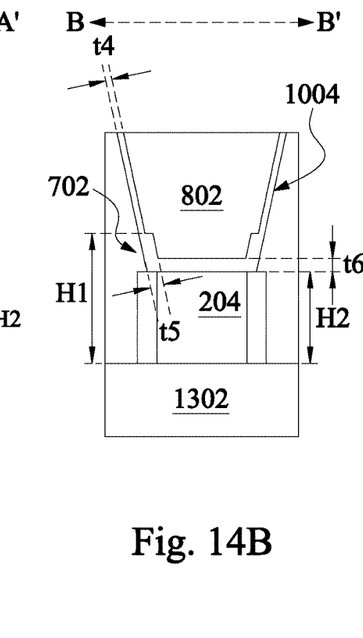
Figure 14C:
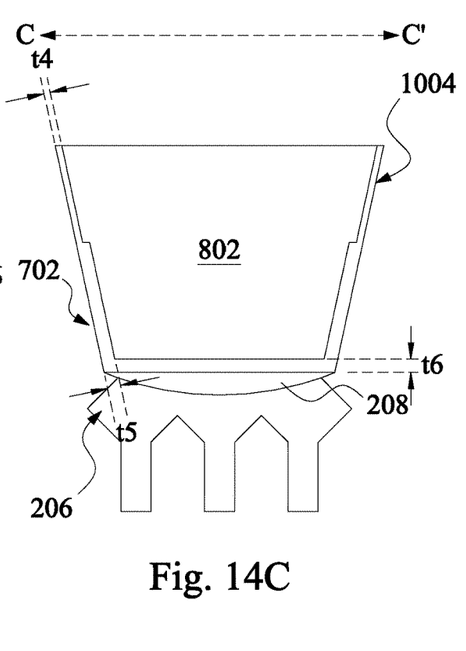
Figure 15A:
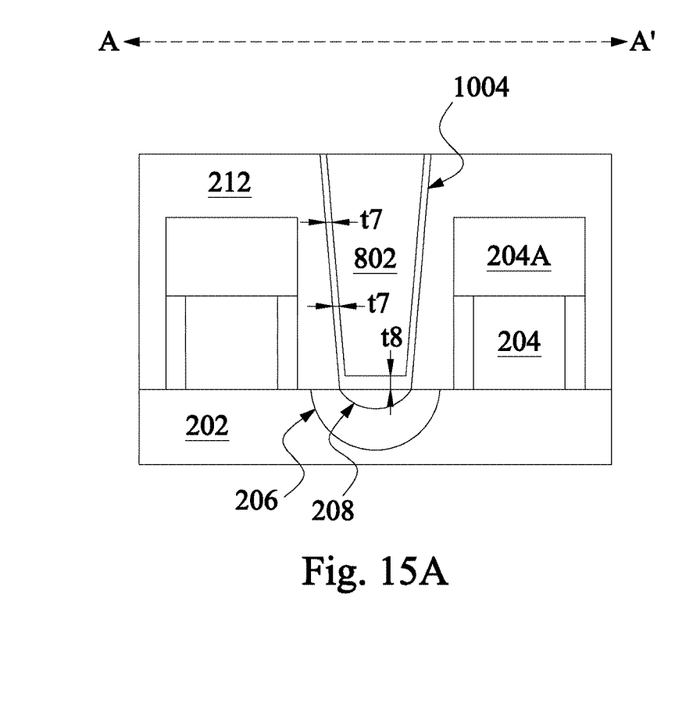
FIGS. 15A, 15B, and 15C are portions of various cross-sectional views of another example embodiment of the device of FIG. 13, according to some aspects of the present disclosure.
Figure 15B:
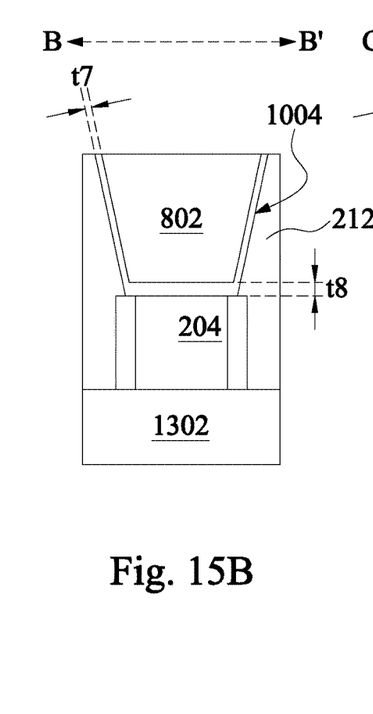
Figure 15C:
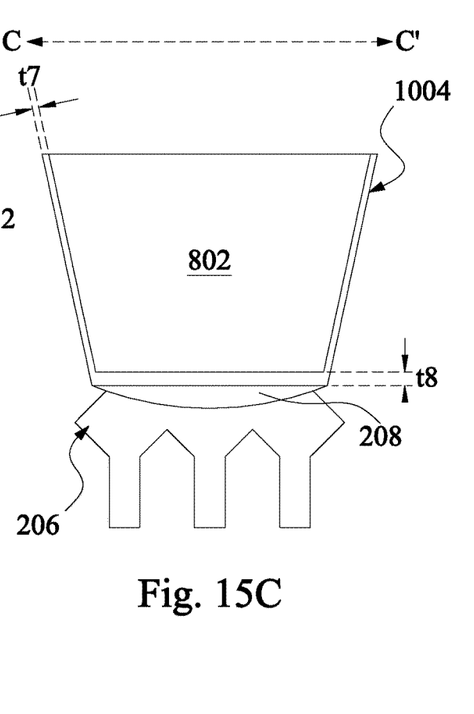

Illustrated in FIGS. 13, 14A, 14B, 14C, 15A, 15B, and 15C are respective semiconductor devices according to one or more aspects of the present disclosure. FIG. 13 illustrates a portion of an exemplary FINFET device 1300 that maybe fabricated using one or more aspects of the present disclosure. FIGS. 14A and 15A are cross-sectional views of different embodiments of the device along the direction of A-A' cut (though illustrating two gate structures), which is along the fin or channel of the device. FIGS. 14B and 15B are cross-sectional views of different embodiments of the device along the B-B' cut, which is along the gate contact. FIGS. 14C and 15C are cross-sectional views of different embodiments of the device along the C-C' cut, which is along the source/drain contact structure (y-axis). It is noted that while FIGS. 14C and 15C provide for a contact structure interfacing a plurality of source/drain features 206, this is illustrative only and not intended to be limiting; the contact feature may interface a single source/drain feature 206 in other embodiments.

The devices of FIGS. 13-15C may be fabricated using one or more of the steps of the embodiments of the method 100 discussed above. In particular, FIGS. 14A, 14B, and 14C provide an exemplary embodiment of the device 200; FIGS. 15A, 15B, and 15C provide an exemplary embodiment of the device 200'. Features may be annotated using the same references numbers above for ease of understanding and avoiding repetition.

As stated above, illustrated in FIGS. 13-15C is a FinFET device 1300. The FinFET device 1300 may be an embodiment of the device 200 and/or device 200' discussed above. The FinFET device 1300 includes one or more fin-based, multi-gate field-effect transistors (FETs). The FinFET device 1300 includes the substrate 202 having at plurality of fins extending therefrom, isolation regions 1302 interpose the fins, the gate structure 204 including spacer elements 210 is disposed on and around the fin-element(s). Each of the plurality of fins of the substrate 202 also include source/drain regions 206 where the source/drain features are formed in, on, and/or surrounding the fin. The source/drain regions 206 may be epitaxially grown on the fins 202. The source/drain regions 206 may include a silicide region 208 where a contact is to be formed.

The FinFET device 1300 in an embodiment, such as shown in FIGS. 14A, 14B, and 14C, includes contact structures 902. The contact structures 902 may be configured substantially similar to as discussed above with reference to FIGS. 2-9. The FinFET device 1300 in an embodiment, such as shown in FIGS. 15A, 15B, and 15C, includes contact structures 1202. The contact structures 1202 may be substantially similar to as discussed above with reference to FIGS. 2-6 and 10-12.

While the forgoing illustrates examples of using the liner layer to form a contact structure, the method 100 and/or aspects of the devices illustrated may also be used with respect to other openings, holes or trenches that are filled in the semiconductor device fabrication processes. As but one example, the method 100 may be used to form layers of a metal gate within a trench provided by a replacement gate process. Thus, a liner layer may be deposited and etched (e.g., in a 1-step or 2-step process) before filling the remaining trench with metal gate layers (e.g., work function). The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

In one embodiment of the present disclosure, provided is a method that includes forming an opening in a layer over a semiconductor substrate. The opening has a sidewall and a bottom. A first deposition process forms a layer of material of a first composition on the sidewall and the bottom. A masking layer is formed in the opening over the layer. A first portion of the layer is etched while using the masking layer to protect a second portion of the layer. The masking layer is removed to expose the second portion of the layer. A second deposition process is performed to deposit material of the first composition over the second portion of layer and on the sidewall of the opening. After performing the second deposition, the opening is filled with a conductive material.

In another embodiment, a method is provided that includes providing a substrate having a gate structure and a source/drain region. A dielectric layer is deposited over the substrate, the gate structure, and the source/drain region. A first opening is etched in the dielectric layer exposing a top surface of the gate structure and a second opening is etched in the dielectric layer exposing a top surface of the source/drain region. A first portion of a liner layer is deposited in the first opening and the second opening. Thereafter, a top region of the first portion of the liner layer is removed from the first opening and the second opening. The top region interfaces a top portion of sidewall of the first and second openings. A second portion of the liner layer is deposited after removing the top region. The first and second portions of the liner layer provide a first thickness on the top portion of the sidewall of the first and second openings and a second thickness on a bottom of the first and second openings, the second thickness being greater than the first thickness.

Also provided is an embodiment of a semiconductor device that includes a gate structure and a source/drain region adjacent the gate structure. A first contact structure interfaces the gate structure. The first contact structure includes a liner layer having a first thickness at an upper portion of the first contact structure and a second thickness at a bottom of the first contact structure. The second thickness is greater than the first thickness. A conductive fill layer is disposed over the liner layer.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a source/drain feature in a semiconductor substrate;
   forming an opening in a first layer over the semiconductor substrate, wherein the opening has a first sidewall, a second sidewall, and a bottom, and wherein the opening overlies the source/drain feature;
   performing a first deposition process to form a liner layer of material of a first composition on the first sidewall and second sidewall and the bottom;
   forming a masking layer in the opening over the liner layer;
   etching a first portion of the liner layer while using the masking layer to protect a second portion of the liner layer;
   removing the masking layer to expose the second portion of the liner layer wherein the exposing the second portion includes expose a surface of the second portion of the liner layer extending from the first sidewall to the second sidewall;
   performing a second deposition process to deposit material of the first composition over the second portion of the liner layer including the exposed surface and on the first sidewall and second sidewall of the opening; and
   after performing the second deposition process, filling the opening with a conductive material.

2. The method of claim 1, wherein the first deposition process includes forming the liner layer of material of the first composition overlying a second composition, wherein the second composition is different than the first composition.

3. The method of claim 1, wherein the first composition is TiN.

4. The method of claim 1, further comprising:
   after removing the masking layer and before performing the second deposition process, performing another etching to remove a region of the second portion of the liner layer disposed on the first sidewall of the opening.

5. The method of claim 4, wherein the another etching does not remove the second portion of the liner layer from the bottom of the opening.

6. The method of claim 4, further comprising:
   performing a directional plasma treatment on the liner layer after the first deposition process.

7. The method of claim 6, wherein the directional plasma treatment alters an etching rate of the first portion and a region of the second portion of the liner layer.

8. The method of claim 1, further comprising:
   forming an interconnect line interfacing a top surface of the conductive material.

9. The method of claim 1, wherein a silicide region is disposed on the source/drain feature in the semiconductor substrate.

10. A method comprising:
    providing a substrate having a gate structure and a source/drain region;
    depositing a dielectric layer over the substrate, the gate structure, and the source/drain region;
    etching a first opening in the dielectric layer exposing a top surface of the gate structure and a second opening in the dielectric layer exposing a top surface of the source/drain region;
    depositing a first portion of a liner layer in the first opening and the second opening;
    removing a top region of the first portion of the liner layer from the first opening and the second opening, wherein the top region interfaces a top portion of a sidewall of the first opening and the second opening; and
    depositing a second portion of the liner layer after removing the top region, wherein the first and second portions of the liner layer provide a first thickness on the top portion of the sidewalls of the first opening and the second opening and a second thickness on a bottom of the first opening and the second opening, the second thickness being greater than the first thickness.

11. The method of claim 10, further comprising:
    filling the first opening and the second opening with a conductive material over the liner layer.

12. The method of claim 10, wherein the removing the top region of the first portion of the liner layer includes:
    depositing a masking element to protect a bottom region of the first portion of the liner layer, wherein the bottom region is disposed on a sidewall of the first opening and the second opening respectively below the top region.

13. The method of claim 12, further comprising:
    removing the masking element prior to depositing the second portion; and
    removing a top region of the first portion of the liner layer from the first opening and the second opening, wherein the top region interfaces a top portion of sidewall of the first opening and the second opening.

14. The method of claim 13, further comprising:
    after the removing the masking element, etching the bottom region of the first portion.

15. A method of fabricating a semiconductor device, comprising:
    providing a gate structure and a source/drain region adjacent the gate structure; and forming a first contact structure interfacing the gate structure, wherein the forming the first contact structure includes:

providing a contact opening;

forming a liner layer having a first thickness at an upper portion of the contact opening and a second thickness at a bottom portion of the contact opening, wherein the second thickness is greater than the first thickness; and filling the contact opening with a conductive fill layer deposited over the liner layer.

16. The method of claim 15, wherein the contact opening exposes a top surface of a gate structure.

17. The method of claim 15, wherein the contact opening exposes a top surface of a source/drain region.

18. The method of claim 17, further comprising:

performing a silicidation of the exposed top surface of the source/drain region after providing the contact opening and before forming the liner layer.

19. The method of claim 15, wherein the forming the liner layer includes depositing titanium.

20. The method of claim 19, wherein the forming the liner layer includes depositing a titanium nitride.

* * * * *